US011133350B2

(12) United States Patent
Edwards

(10) Patent No.: US 11,133,350 B2
(45) Date of Patent: Sep. 28, 2021

(54) INTEGRATED CIRCUIT WITH THERMOELECTRIC POWER SUPPLY

(75) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 67 days.

(21) Appl. No.: 12/790,688

(22) Filed: May 28, 2010

(65) Prior Publication Data

US 2011/0023929 A1     Feb. 3, 2011

Related U.S. Application Data

(63) Continuation-in-part of application No. 12/201,679, filed on Aug. 29, 2008.

(60) Provisional application No. 60/968,805, filed on Aug. 29, 2007, provisional application No. 61/182,055, filed on May 28, 2009, provisional application No. 61/182,052, filed on May 28, 2009.

(51) Int. Cl.
  *H01L 35/32*   (2006.01)
  *H01L 27/16*   (2006.01)
(52) U.S. Cl.
  CPC .............. *H01L 27/16* (2013.01); *H01L 35/32* (2013.01)
(58) Field of Classification Search
  USPC .................................................. 136/212, 205
  See application file for complete search history.

(56) References Cited

U.S. PATENT DOCUMENTS

| 5,261,747 | A | * | 11/1993 | Deacutis et al. | ............... 374/137 |
| 6,806,470 | B2 | * | 10/2004 | Iida et al. | .................. 250/338.1 |
| 2007/0125414 | A1 | * | 6/2007 | Bettencourt | ................... 136/205 |
| 2008/0115818 | A1 | * | 5/2008 | Cheng | ..................... H01L 35/00 |
| | | | | | 136/205 |
| 2009/0056345 | A1 | | 3/2009 | Edwards et al. | |
| 2010/0031992 | A1 | * | 2/2010 | Hsu | ........................... G01J 5/12 |
| | | | | | 136/223 |

* cited by examiner

*Primary Examiner* — Dustin Q Dam
(74) *Attorney, Agent, or Firm* — Michael A. Davis, Jr.; Charles A. Brill; Frank D. Cimino

(57) ABSTRACT

Thermoelectric generator elements and associated circuit elements are simultaneously formed using a common semiconductor device fabrication process to provide an integrated circuit including a dynamically reconfigurable thermoelectric generator array on a common chip or die substrate. A switch logic circuit formed together with the thermoelectric generator elements is configured to control series and parallel connections of the thermoelectric generator elements is the array in response to changes in circuit demand or changes in the available ambient energy source. In an example implementation, the number of generators connected in series may be varied dynamically to provide a stable voltage source, and the number of generators connected in parallel may be varied dynamically to provide a stable current source.

5 Claims, 15 Drawing Sheets

INTEGRATED CIRCUIT WITH THERMOELECTRIC POWER SUPPLY

This application is a continuation-in-part of U.S. application Ser. No. 12/201,679, filed Aug. 29, 2008; and also claims the benefit of U.S. Provisional Application No. 61/182,055, filed May 28, 2009, and U.S. Provisional Application No. 61/182,052, filed May 28, 2009, the entireties of all three of which are incorporated herein by reference.

BACKGROUND

This relates to the field of integrated circuits and, more particularly, to a regulated thermoelectric power supply in an integrated circuit.

Integrated circuits are frequently used in portable and implanted devices. Batteries are the primary means of supplying the power to run the integrated circuits in these portable devices. More recently, various means of harvesting ambient energy are being employed to address problems with battery wear and replacement. Solar cells, vibration activated generators, and thermoelectric devices that convert thermal energy to electrical energy are some examples that are being used to augment or replace batteries. In many instances the ambient energy source lacks the stability to convert the energy to a stable source of voltage or current for the integrated circuit. For example, the light intensity may vary causing the output of a solar cell to change, or the ambient temperature may vary causing the output of a thermoelectric generator to change. Because voltage and power stability is important for many integrated circuits, ambient energy generators are typically used in secondary roles, to recharge a battery which serves as the primary power source for the integrated circuit.

Some circuits may be required to operate intermittently and only under certain ambient conditions. For example, a circuit designed to send out a warning signal when the temperature goes above freezing may remain dormant for months or years, or a circuit designed to close window shades may be required to operate only when the sun is shining. In these cases, the energy may be harvested from the ambient environment. A battery may still be used, however, to deliver a constant flow of energy to the circuit when the ambient light intensity or temperature changes.

SUMMARY

In one aspect, the invention provides a thermoelectric generator array incorporated with an integrated circuit. In another aspect, the invention provides a method of manufacturing thermoelectric generators together with circuitry in an integrated circuit.

In a described example, thermoelectric generator elements and associated circuit elements are simultaneously formed using a common semiconductor device fabrication process to provide an integrated circuit including a dynamically reconfigurable thermoelectric generator array on a common chip or die substrate. A switch logic circuit formed together with the thermoelectric generator elements is configured to control series and parallel connections of the thermoelectric generator elements is the array in response to changes in circuit demand or changes in the available ambient energy source. In an example implementation, the number of generators connected in series may be varied dynamically to provide a stable voltage source, and the number of generators connected in parallel may be varied dynamically to provide a stable current source.

DETAILED DESCRIPTION OF EXAMPLE EMBODIMENTS

On-chip thermoelectric generators that may be formed at the same time as circuit elements of an integrated circuit are described in US 2009/0056345 A1, which is incorporated herein by reference.

Figure 1:
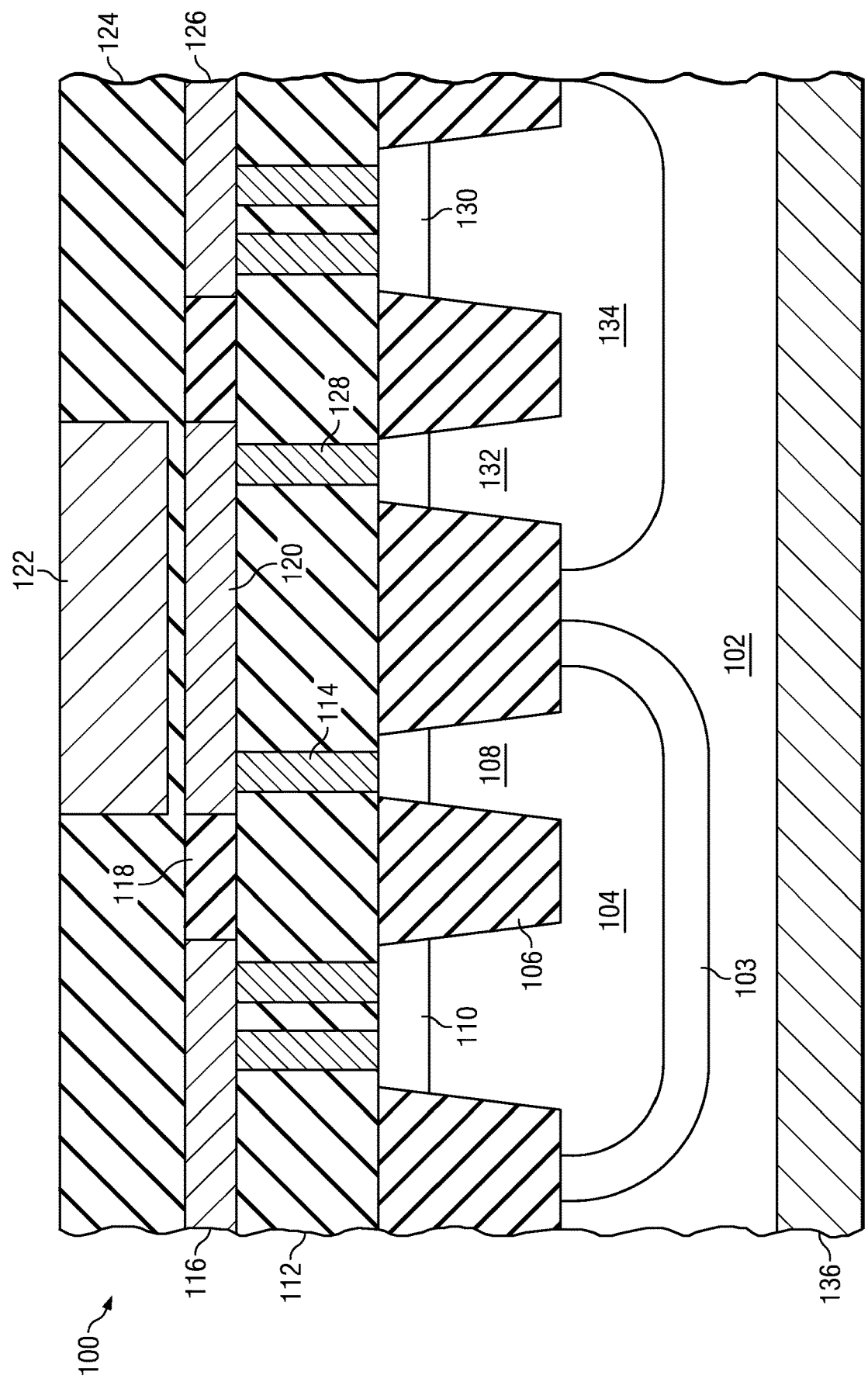
FIGS. 1-3 illustrate examples of thermoelectric generators that may be integrated on an integrated circuit chip.

An example thermoelectric generator ("thermogenerator") 100, shown in FIG. 1, is formed on a substrate which has a p-doped region 102 of semiconductor material (e.g., silicon or silicon germanium) and includes an n-doped well (nwell) 134 having a nwell tap or contact region, a p-doped well (pwell) 104 having a pwell tap or contact region, shallow trench isolation (STI) regions 106, a p-type thermopile 108, an n-type thermopile 132, heavily n-doped regions 130 at the top surface of the n-type thermopile 132 and nwell tap or contact region, heavily p-doped regions 110 at the top surface of the p-type thermopile 110 and pwell tap or contact region, a premetal dielectric layer (PMD) 112, conductive contacts 114 (e.g., tungsten) formed within openings through the premetal dielectric layer 112 to the heavily doped regions 110, conductive contacts 128 (e.g., tungsten) formed within openings through the premetal dielectric layer 112 to the heavily doped regions 130, a first intermetal dielectric layer 118, first metal (metal-1) layer elements 116, 120, 126 (e.g., copper) located within openings or vacancies formed in the first intermetal dielectric (IMD) layer 118, and a top thermal terminal 122 which is electrically isolated from first metal elements 120 by a second intermetal dielectric layer 124. A bottom thermal terminal 136 may be constituted by the bulk substrate and/or by an outside element connected to the bulk substrate. Pwell 104 is surrounded by a deep n-doped well (dnwell) 103 to provide electrical isolation between pwell 104 and substrate semiconductor layer 102. The n-type thermopile 132 and the p-type thermopile 108 form a thermocouple.

Top thermal terminal 122 and bottom thermal terminal 136 may be attached through packaging, thermal grease, solder, or other means to sources of ambient heat and cold. For example, the top thermal terminal 122 may be in a watch worn on a person's arm and heated with body heat, with the bottom thermal terminal 136 exposed to and cooled by ambient air. In some cases, the temperature difference may reverse sign, so that the direction of heat flow through the thermocouple reverses and the voltage generated across terminals 116 and 126 also reverses sign. For purposes of illustration, the conventional notation for heat flow is used wherein the top thermal terminal 122 is discussed as having the higher temperature and the bottom thermal terminal 136 is discussed as having the lower temperature. It should be understood, however, that either thermal terminal may have the higher temperature; and, in particular, the top thermal terminal 122 may have the lower temperature and the bottom thermal terminal 136 may have the higher temperature. In the latter case, as will be appreciated by those skilled in the art, heat flows, voltage polarities and current flows will be opposite to those described.

In operation, heat flows from the higher temperature heat source at thermal terminal 120 to the underlying metal element 120 through the electrically isolating intervening dielectric material of layer 124. From the metal element 120, it then flows through contacts 114, 128 and the heavily doped regions 110, 130 to the tops of the p-type and n-type thermopiles 108, 132. It then flows through the thermopiles 108, 132, out the bottom of the wells 104, 134, through the well electrical isolation of the deep well 103 and bulk doped semiconductor material 102, and to the heat sink provided by the bottom thermal terminal 136. A significant temperature gradient forms vertically between the heated top of each thermopile 108, 132 and the colder bottom thermal terminal 102. Electron-hole pairs are generated in the top thermal terminal 120. Thermally generated holes diffuse through the p-type thermopile 108, across the pwell 104 to the other pwell heavily doped region 110 and contacts 114, producing a positive charge on a terminal comprising metal element 116. Thermally generated electrons diffuse through the n-type thermopile 132, across the nwell 134 to the other nwell heavily doped region 130 and contacts 128, producing a negative charge on a terminal comprising metal element 126. A voltage is thus thermally induced across a thermocouple according to what is known as "the Seebeck effect." A maximum voltage difference $V_{OC}$ generated between positive terminal 116 and negative terminal 126 occurs when the thermocouple is in an open-circuit condition, and may be calculated using the Seebeck equation:

$$V_{OC}=(\alpha_p-\alpha_n)\Delta T; \quad (1)$$

where $\alpha_p$ is the Seebeck coefficient for the pwell 104 (p-type thermopile silicon material), $\alpha_n$ is the Seebeck coefficient for the nwell 134 (n-type thermopile silicon material), and $\Delta T$ is the applied temperature difference. Since the Seebeck coefficient for p-type silicon is positive and that for n-type silicon is negative, the voltages add for the thermocouple to a single value, $\alpha_{pn}=(\alpha_p-\alpha_n)$. The open-circuit voltage $V_{OC}$ is obtained when the thermogenerator is connected to an infinite load impedance, so no current is drawn through the internal resistance R of the thermogenerator.

Figure 2:
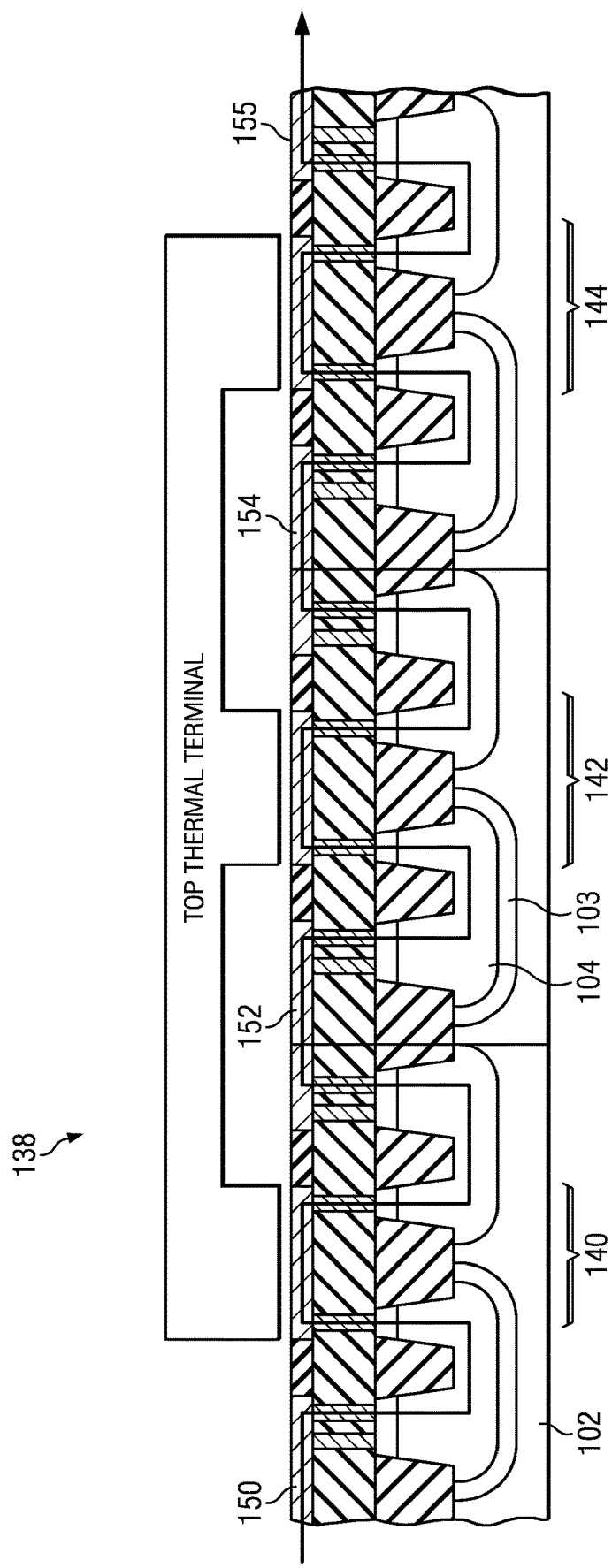

As shown in FIG. 2, a plurality of thermoelectric generators 140, 142, 144 may be electrically coupled in series to increase the output voltage across positive and negative terminals 150, 155 of a composite thermoelectric voltage generating structure 138. The thermogenerators are shown electrically coupled in series by connecting the output heavily doped region 130 of nwell 134 of one generator 132 to an input heavily doped region 110 of a next adjacent pwell 104, for example by forming adjacent metal elements 126, 116 as common metal elements 152, 154. Pwells 104 of the series-coupled thermogenerators 142, 144 are formed in deep nwells 103 to prevent shorting to the bulk p-type silicon 102. A maximum voltage difference developed across the output terminals 150, 155 is given by the Seebeck voltage equation for series thermoelectric generators:

$$V_{OC}=N\alpha_{pn}\Delta T; \quad (2)$$

where N is the number of thermocouples in series (N=3 in the example series coupling shown in FIG. 2), $\alpha_{pn}$ is the combined Seebeck coefficient $\alpha_{pn}=(\alpha_p-\alpha_n)$ discussed in connection with equation (1) above, and $\Delta T$ is the applied temperature difference.

In a similar manner, a plurality of like thermogenerators (e.g., identical thermogenerators coupled to same connectors 150, 152, 154, 156 behind thermogenerators 140, 142, 144 in FIG. 2) may be electrically coupled in parallel to the illustrated thermogenerators 140, 142, 144 to increase the output current across positive and negative terminals 150, 155 of the composite thermoelectric voltage generating structure 138.

Figure 4:
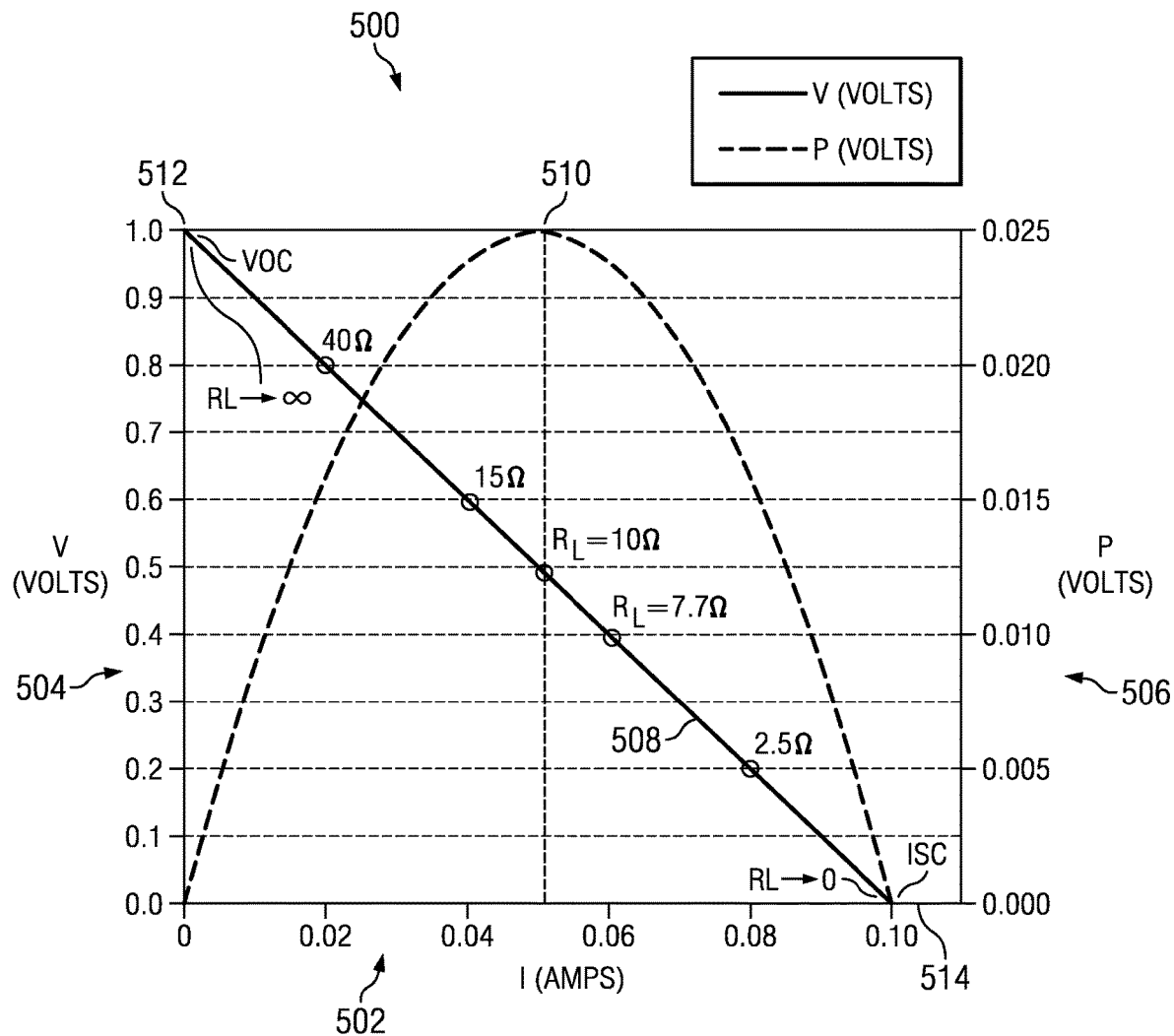
FIG. 4 is a graph of power vs. loading for an example thermoelectric generator.

FIG. 4 shows a more typical form 154 of the thermogenerator 100 of FIG. 1. The illustrated thermogenerator 154 has a multiple thermopile arrangement 156 with a plurality of thermopiles 108 (FIG. 1) associated with a common same p-type well, and a multiple thermopile arrangement 158 with a plurality of thermopiles 132 (FIG. 1) associated with a common same n-type well. A positive terminal 160 for the composite multiple thermopile structure 154 comprises a metal element 116 connected through conductive contacts 114 to the tap region of the common pwell 159. A negative terminal 162 for the composite multiple thermopile structure 154 comprises a metal element 126 connected through conductive contacts 128 to the tap region of the common nwell 161. Pluralities of thermocouples having the multi-thermopile arrangements 156, 158 of thermogenerator 154 may likewise be coupled in series and/or parallel by connections of their respective interconnect elements 116, 120, 126 as described above in connection with FIG. 2.

A maximum current flow $I_{SC}$ between terminals 160, 162 (at zero impedance load or short circuit condition) is given by Ohm's Law, as follows:

$$I_{SC}=V_{OC}/(R/M)=\alpha_{pn\Delta T}/(R/M)=M\alpha_{pn\Delta T/R} \quad (3)$$

where $V_{OC}$ is the open circuit voltage given by equation (1), R is the internal resistance of each unit thermogenerator, M is number of thermoelectric generator units (i.e., n-type and p-type thermopile pairs) coupled in parallel, $\alpha_{pn}$ is the combined Seebeck coefficient $\alpha_{pn}=(\alpha_p-\alpha_n)$, and $\Delta T$ is the applied temperature difference.

When the output of a thermogenerator is connected to a load having resistance $R_L$, the Seebeck voltage drives two resistances in series: the internal resistance $R_I$ of the composite thermoelectric voltage or current generating structure and the load resistance $R_L$. The current $I_L$ through the load in this configuration is given by Ohm's law, as follows:

$$I_L=V_{OC}/(R_I+R_L)=\alpha_{pn\Delta T}/(R_I+R_L) \quad (4)$$

The power $P_L$ delivered to the load is then:

$$P_L=I_L^2R_L=(\alpha_{pn\Delta T})^2R_L/(R_I+R_L)^2 \quad (5)$$

A simple calculation reveals that the maximum power is delivered to the load when the load resistance is matched to the overall internal series resistance $R_I=R_L$. The maximum power delivered in a matched configuration is thus:

$$P_{Max}=I_L^2R_L=\frac{1}{4}(\alpha_{pn}\Delta T)^2/R=\frac{1}{4}V_{OC}I_{SC}. \quad (6)$$

A graph 500 of the power delivered to a load (the integrated circuit load in this case) is shown in FIG. 4. The voltage at the output terminals of the thermogenerator structure are on the left-hand y-axis 504, the current delivered by the thermogenerator structure is given on the x-axis 502, and the power delivered to the load (i.e., the integrated circuit load) is plotted on the right-hand y-axis 506. The load line 508 goes from the open circuit (maximum voltage output) condition 512 in the upper left-hand corner of the graph where the load resistance $R_L$ is infinite, to the short circuit (maximum current output) condition 514 in the lower right-hand corner of the graph where $R_L$ is zero. The power reaches a maximum 510 when the load resistance $R_L$ is matched to the internal resistance $R_I$ of the thermogenerator structure. It is therefore advantageous to be able to adjust the internal resistance $R_I$ of the thermogenerator structure so that, in combination with the load resistance $R_L$, the total impedance seen by the thermogenerator structure will match the maximum power point on the load line curve. Under this maximum power condition, the thermogenerator structure will provide the maximum power to the integrated circuit load.

Multiple thermoelectric generators (e.g., thermogenerator units with single or multiple n-type and p-type thermopile pairs) may be configured in parallel and in series to form an N×M array of thermogenerators to provide a desired voltage and current.

Figure 5:
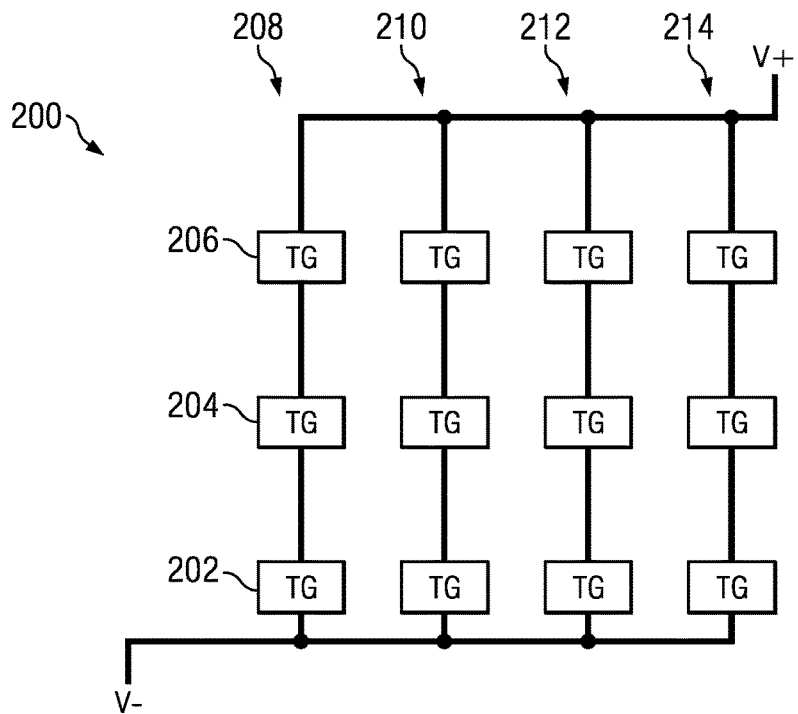
FIG. 5 illustrates an example of a hardwired thermoelectric generator array.

FIG. 5 illustrates an example array 200 (shown schematically in an N row×M column format) having 12 thermogenerators coupled in a fixed 3×4 series/parallel arrangement ("hardwired"), with three rows of thermogenerators 202, 204, 206 hardwired in series (such as, for example, done for the series coupling of the three thermogenerators 140, 142, 144 described above) and with four columns of thermogenerators 208, 210, 212, 214 hardwired in parallel (such as, for example, done for the parallel coupling of the thermogenerators 140, 142, 144, described above).

Using equation (2) above, the N×M unit array 200 provides a maximum voltage $V_{OC}=N\alpha_{pn}\Delta T$, with N=3 (number of units in series) for the example 3×4 array. The internal series resistance of the N×M series/parallel array of thermogenerators (N units in series and M units in parallel, each unit having internal resistance R) is $R_{Array}=NR/M$. The short-circuit current through the N×M array is given by:

$$I_{SC}=V_{OC}/R_{Array}=N\alpha_{pn}\Delta T/(NR/M)=M\alpha_{pn}\Delta T/R \qquad (7)$$

with M=4 (number of units in parallel) for the example 3×4 array. The maximum power supplied to a matched load $R_L=NR/M$ is thus:

$$P_{Max,Array} = \frac{1}{4}V_{OC}I_{SC} = \frac{1}{4}MN(\alpha_{pn}\Delta T)^2/R \qquad (8)$$

As expected from conservation of energy, the maximum generated power scales with the number of thermogenerators in the array.

For the N×M array of thermogenerators shown in FIG. 4, $$R_{Array} = NR/M; \qquad (9)$$

$$I_{L,Max} = \frac{1}{2}I_{SC} = \frac{1}{2}M\alpha_{pn}\Delta T/R; \qquad (10)$$

$$V_{L,Max} = \frac{1}{2}V_{OC} = \frac{1}{2}N\alpha_{pn}\Delta T; \text{ and} \qquad (11)$$

$$P_{Max,Array} = \frac{1}{4}MN(\alpha_{pn}\Delta T)^2/R. \qquad (12)$$

The power is maximized for a load resistance $R_L$ when $R_L=R_{Array}$. However, if the load resistance $R_L$ changes (for instance by an increase in the activity of the circuit being driven), then N and/or M must be changed to adjust $R_{Array}$ in order to keep it equal to $R_L$ to maintain the matching condition.

In some cases, it may be desirable to maintain the voltage $V_{L,Max}$ applied to the load at a constant level. In such cases, changing M (number of units in parallel) will enable the load current to be varied while maintaining a constant load voltage. In other cases, it may be desirable to maintain the current $I_{L,Max}$ applied to the load at a constant level. In such cases, changing N (number of units in series) will enable the load current to be varied while maintaining a constant load voltage. If the ambient temperature difference $\Delta T$ changes to $\Delta T'$, M and N may both be changed to M' and N' to maintain a constant voltage and constant current, as follows: $N'=(\Delta T/\Delta T')N$ and $M'=(\Delta T/\Delta T')M$. With these adjustments, $R_{Array}$ can be kept the same, thereby preserving the load matching condition. Consequently $P_{Max,Array}$, $I_{L,Max}$, and $V_{L,Max}$ may all be kept constant. Thus, it is desirable to be able to adjust N and M dynamically as temperature conditions and load demand vary over time.

In accordance with one advantageous implementation, transistor switches and logic circuits may be formed simultaneously with the formation of the thermoelectric generator units and used to dynamically reconfigure a thermoelectric generator array to provide a controlled output voltage and/or a controlled output current despite fluctuations in temperature across the thermopiles, and/or to adjust the internal resistance R of the thermogenerator units in response to variations in the circuit load resistance $R_L$. Such arrays are shown schematically in FIGS. 6, 7A, 7B, 8A and 8B.

Figure 3:
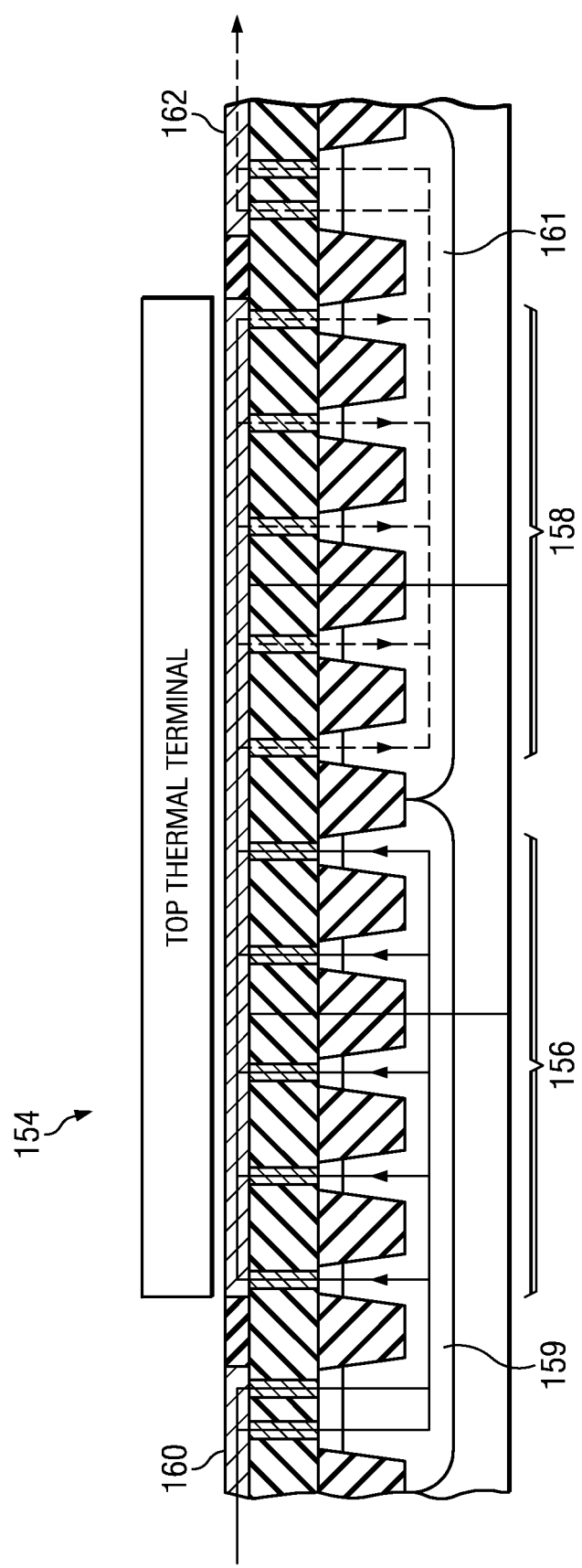
Figure 6:
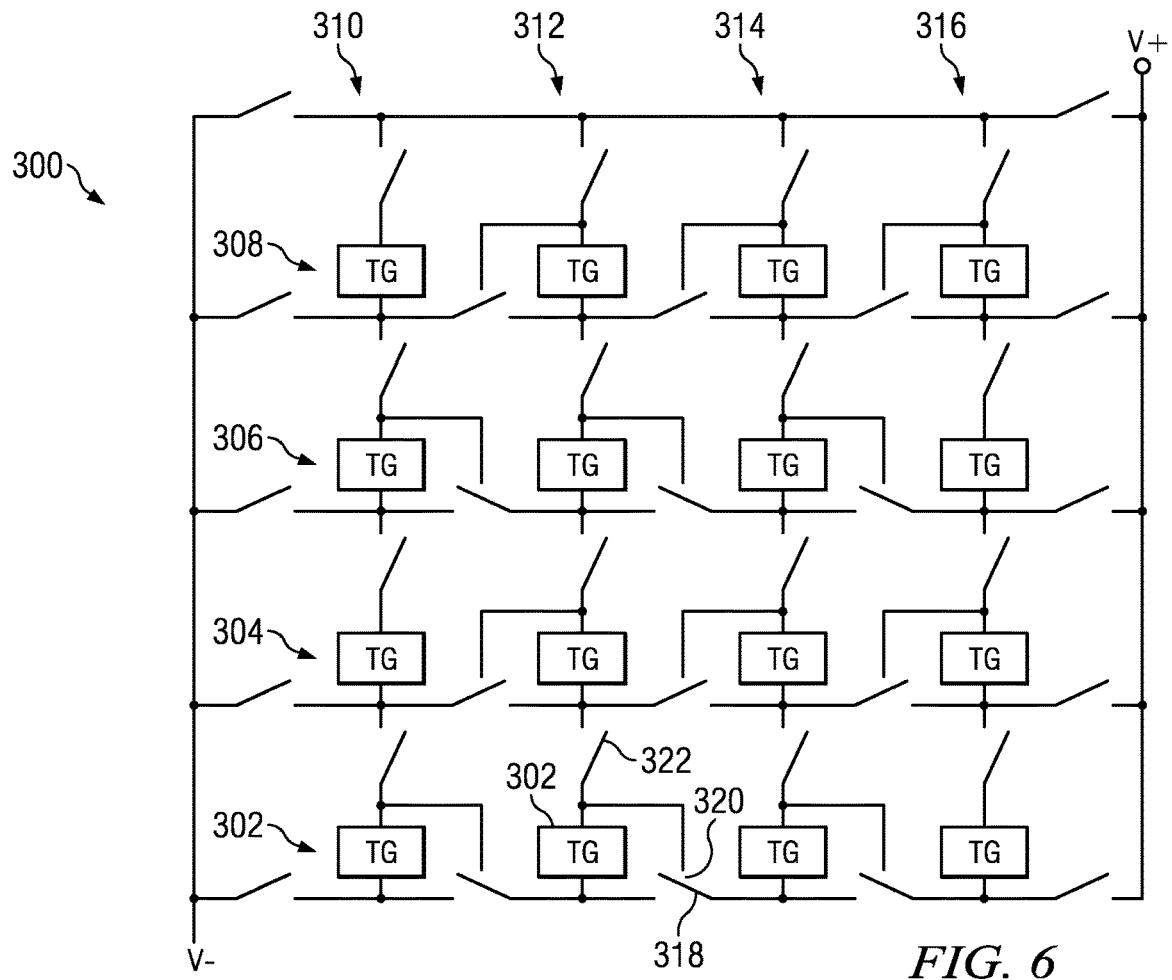
FIGS. 6, 7A, 7B, 8A and 8B illustrate example reconfigurable thermoelectric generator arrays according to principles of the invention.

FIG. 6 illustrates an example array 300 (shown schematically in an N row×M column format) of 16 thermogenerators selectively coupled in a reconfigurable 4×4 series/parallel arrangement ("softwired"), with four thermogenerators 302, 304, 306, 308 selectively placed in series (such as by providing transistor switchable connections for series couplings between thermogenerators 140, 142, 144 discussed above), and with four thermogenerators 310, 312, 314, 316 softwired in parallel (such as by providing transistor switchable connections for parallel couplings between thermogenerators 140, 142, 144 discussed above). The thermogenerators may, of course, be multiple thermopile units as described in connection with FIG. 3. Alternately, if desired, a combination of softwiring and hardwiring may be utilized, with hardwired unit arrays (such as described in connection with FIG. 5) occupying each thermogenerator ("TG") position shown in FIG. 6 in a switchable (e.g., transistor switched connection) "super" array.

Switches 318, 320, 322 associated with each thermogenerator unit position ("TG") can be dynamically controlled to allow the array to be reconfigured responsive to variation in (viz., voltage, current, temperature differential, load resistance) needs or conditions by switching thermogenerator units into and out of various series and parallel coupling combinations. Switches 318, 320, 322 may be transistor switches formed together on a common substrate with the thermopiles and interconnected for control by logic circuitry integrated on the same chip or die. For example, voltage may be adjusted (or kept constant in response to changes in other voltage influencing factors) by dynamically making or breaking series couplings of (e.g., adjacent) thermogenerators; current may be adjusted (or kept constant in response to changes in other factors) by making or breaking parallel couplings of thermogenerators to each other or to a common bus; or other adjustments may be made by switching thermogenerators with differing configurations (e.g., different thermopile arrangements or resistances) into or out of the active array. Likewise, units can be switched in or out of the array to vary (or keep constant) voltage or current or power as the ambient temperature rises or falls, or to keep the resistance $R_{Array}$ matched to the load resistance $R_L$ of powered circuitry when the integrated circuit loading changes.

Figure 7A:
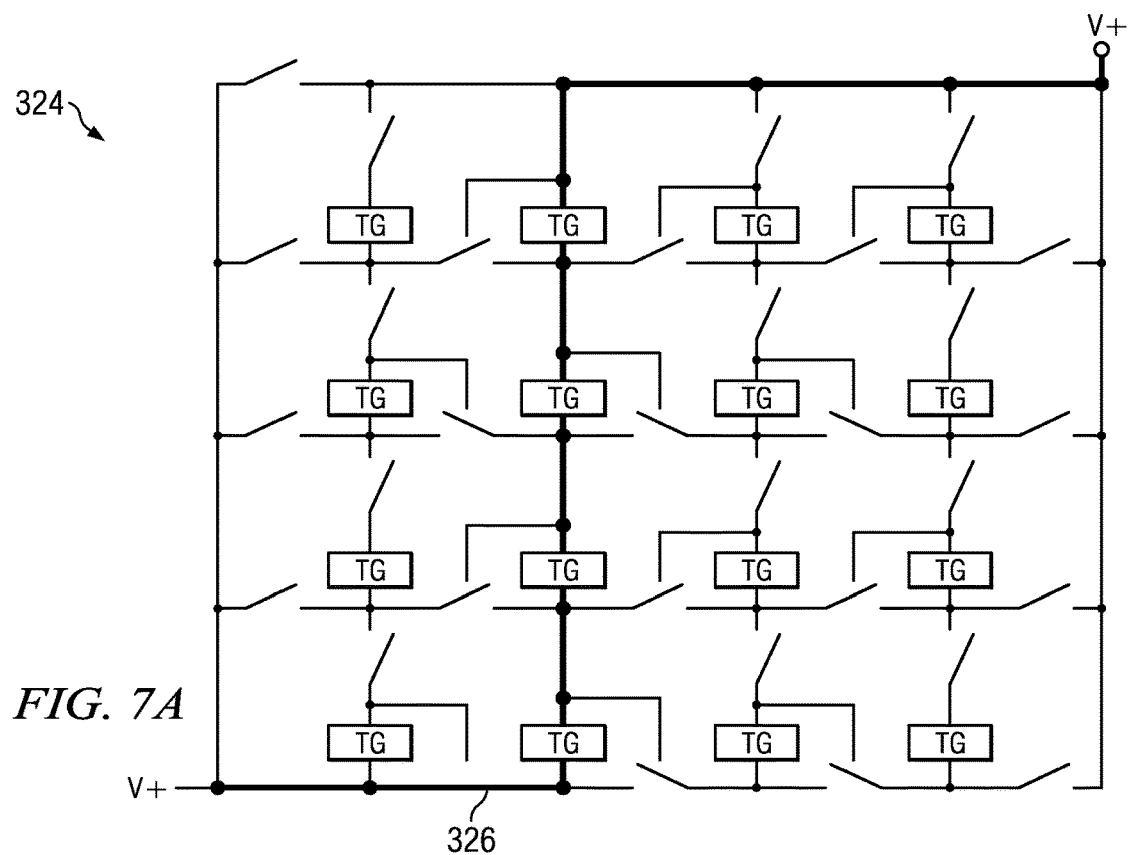
Figure 7B:
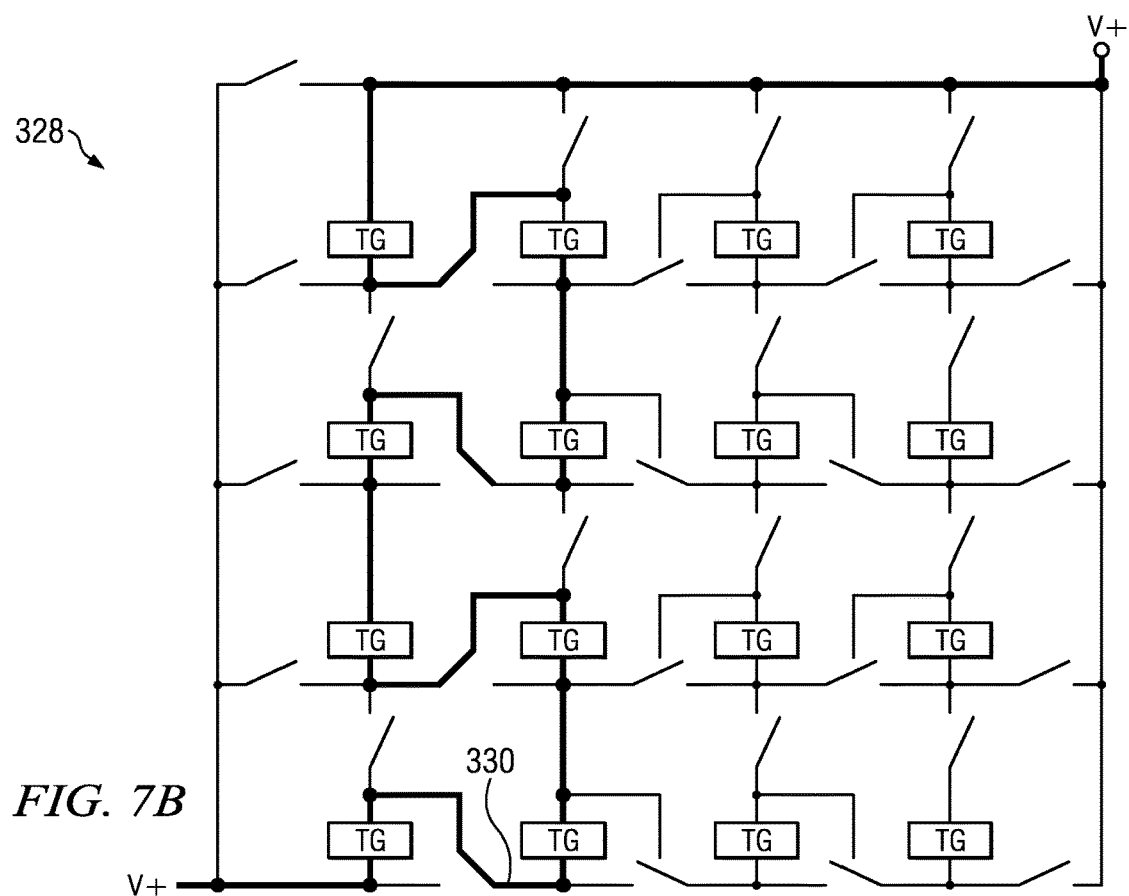

FIGS. 7A and 7B show example thermogenerator arrays 324, 328, with thermogenerators softwired in series by activation of switches, as shown by bold lines 326, 330 to provide different output voltages at a same output current. The array shown in FIG. 7A is switched to put four thermogenerators in series, for a maximum voltage output $V_{OC}=N\alpha_{pn}\Delta T$ with N=4. The array in FIG. 7B is selectively switched to put eight thermogenerators in series for a maximum voltage $V_{OC}$ with N=8. The output voltage of array 328 may be twice that of array 324.

Figure 8A:
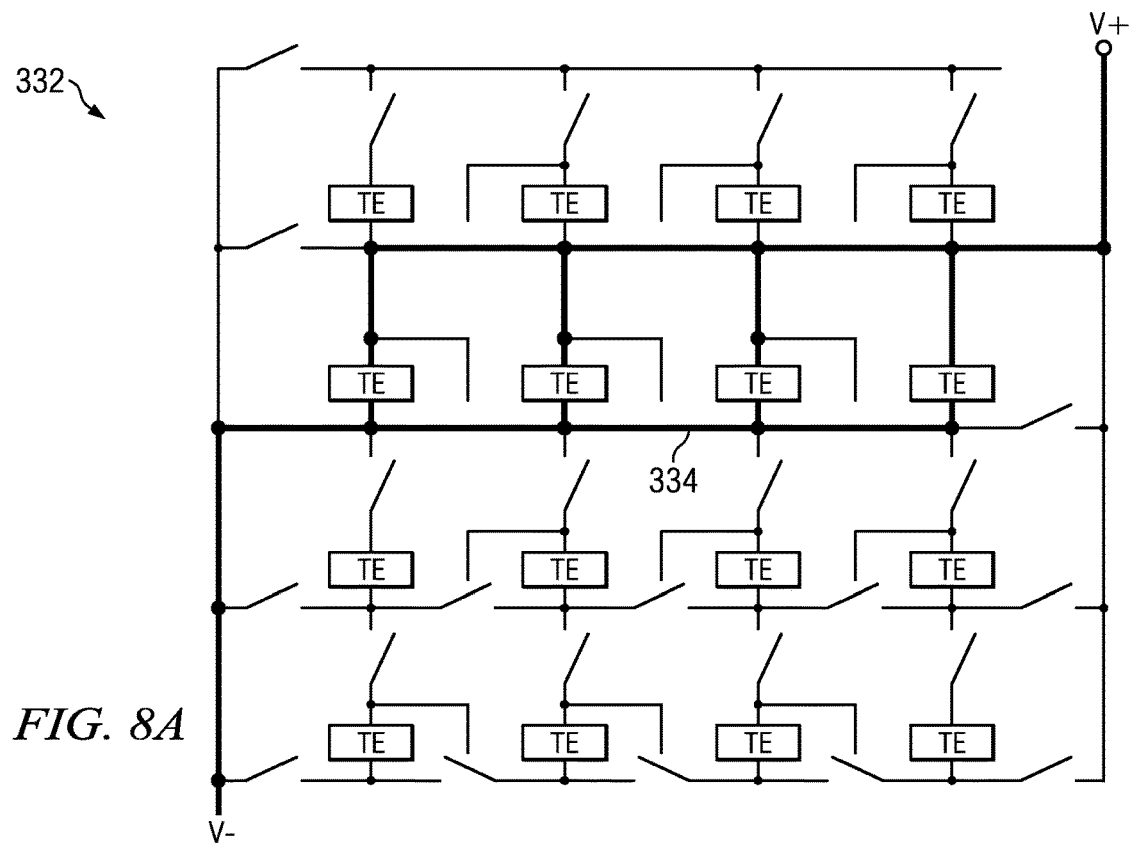
Figure 8B:
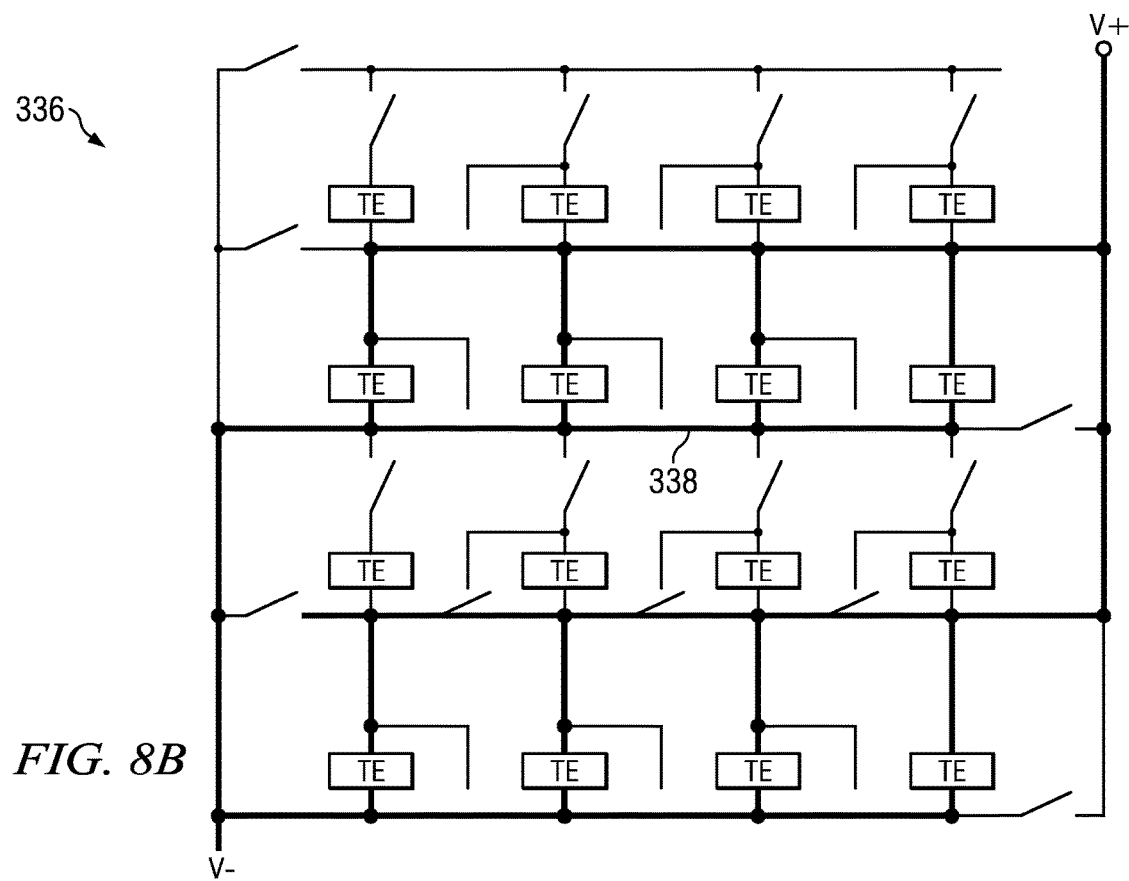

FIGS. 8A and 8B show example thermogenerator arrays 332, 336 with thermogenerators softwired in parallel by activation of switches, as shown by the bold lines 334, 338 to provide different output currents at a same output voltage. The array shown in FIG. 8A is switched to put four thermogenerators in parallel, for a maximum current output $I_{SC}=M\alpha_{pn}\Delta T/R$ with M=4. The array in FIG. 8B is selectively switched to put eight thermogenerators in parallel for a maximum current $I_{SC}$ with M=8. The output current of array 336 may be double that of array 332.

The preceding analysis of load resistance matching to obtain maximum power assumes that a load behaves as a linear resistor $R_L$. For some loads such as a battery, the load line may be highly nonlinear, in particular the differential impedance looking into the battery may approach zero for voltages exceeding the battery voltage. In such cases, a different algorithm may be used to provide the maximum power into a load. For the case of charging a battery, for example, one criterion for determining the algorithm to use may be the point at which the voltage generated by the array exceeds the voltage of the battery. Another criterion may be to maximize the number of parallel thermogenerators to maximize the current at the battery voltage. Other practical limits such as avoiding an overcurrent or an overvoltage condition in the battery may also be criteria included in the algorithm.

Figure 9:
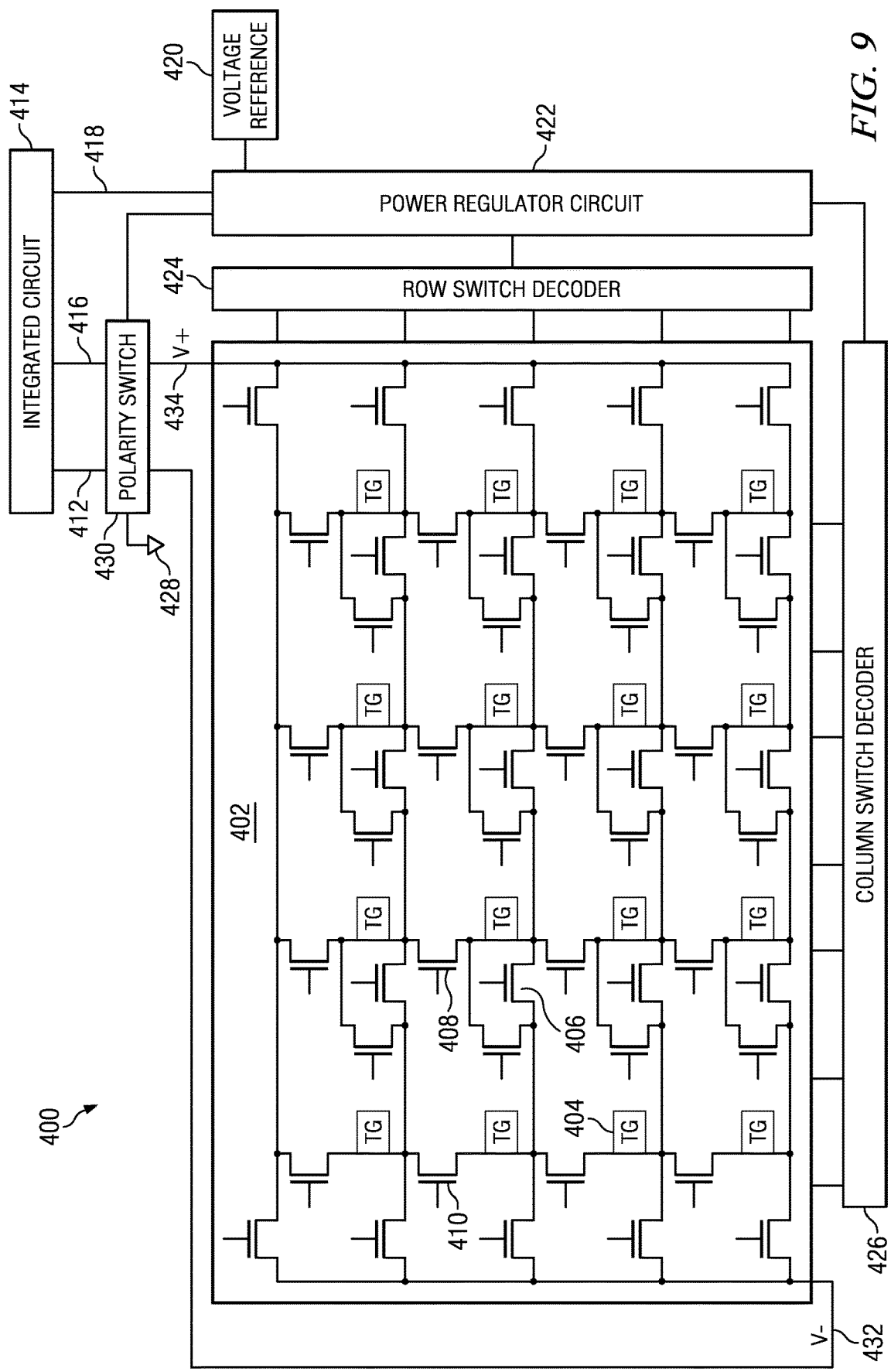
FIG. 9 is a block diagram of an integrated circuit with a dynamically reconfigurable, regulated thermoelectric generator power supply according to principles of the invention.

FIG. 9 is a block diagram of an integrated circuit 400 incorporating a dynamically reconfigurable thermoelectric generator power supply and other circuitry on a single chip or die. The thermoelectric generator array 402 includes a plurality of thermogenerators 404 ("TG") selectively connectable in series or parallel arrangements by means of associated switches (e.g., MOS transistor coupling switches) 406, 408, 410, to provide regulated voltage and/or current at positive ("V+") and negative ("V−") terminals 434, 432. A power regulator circuit 422 formed as part of the same integrated circuit with the thermogenerators is configured to control the settings of the switches 406, 408, 410 by sending signals to a row switch decoder circuit 424 and a column switch decoder circuit 426. Control is effected to couple more thermogenerators 404 in series if more voltage is required, to wire fewer thermogenerators 404 in series if less voltage is required, to wire more thermogenerators 404 in parallel if more current is required, and/or to wire fewer thermogenerators 404 in parallel if less current is required. The row switch decoder circuit 424 may open or close row transistor switches 406 and the column switch decoder 426 may open or close column switches 408, 410 as needed to selectively add or remove thermoelectric generators 404 dynamically in response to detected changing conditions. Switches 406, 408, 410 shown as transistors may alternatively be configured by pass gates or other devices that can selectively make or break connections among the thermogenerators.

The circuitry associated with the array 402 may include a polarity switch 430 for reversing the polarity of the voltage delivered by the terminals 432, 434 to other circuitry 414. This can be advantageous to enable the delivery of same polarity voltage or current should the heat source and sink functions be interchanged (i.e., should the top thermal terminal 122 be at the lower temperature and the bottom thermal terminal 136 be at the higher temperature). One side (e.g., one of terminals 432, 434) of the thermogenerator array 402 may be tied to ground 428.

The thermoelectric generator 402 provides power to other circuitry 414 on the same through interconnects 412, 416. The integrated circuit other circuitry 414 may provide input (e.g., sensor input) or send feedback through a connection 418 to the power regulator circuit 422 to indicate when more or less voltage, current or power is required. A reference voltage source 420 is optionally included as a reference input to the power regulator circuit 422. One method of voltage regulation may, for example, use an operational amplifier to compare the generated voltage 416 to a reference voltage (such as, e.g., a bandgap reference voltage, a zener reference voltage, or a battery reference voltage) and to generate a signal proportional to a voltage difference which the power regulator circuit 422 may then use to determine how to reconfigure the thermogenerator array 402.

An integrated circuit may have more than one dynamically reconfigurable thermogenerator power supply to deliver more than one regulated voltage and/or more than one regulated current to the other circuitry of the integrated circuit. The thermogenerators 404 in array 402 may be identical or different generators; and, as already indicated, the thermogenerator positions ("TG") in the switchable array 402 may be individual thermogenerator units, hardwired arrays of plural thermogenerator units, or some combination of individual and hardwired arrays. Other configurations are also possible.

FIGS. 10A-10G illustrate example steps in a method for the simultaneous fabrication of integrated thermoelectric generators and transistor switches according to principles of the invention.

Figure 10A:
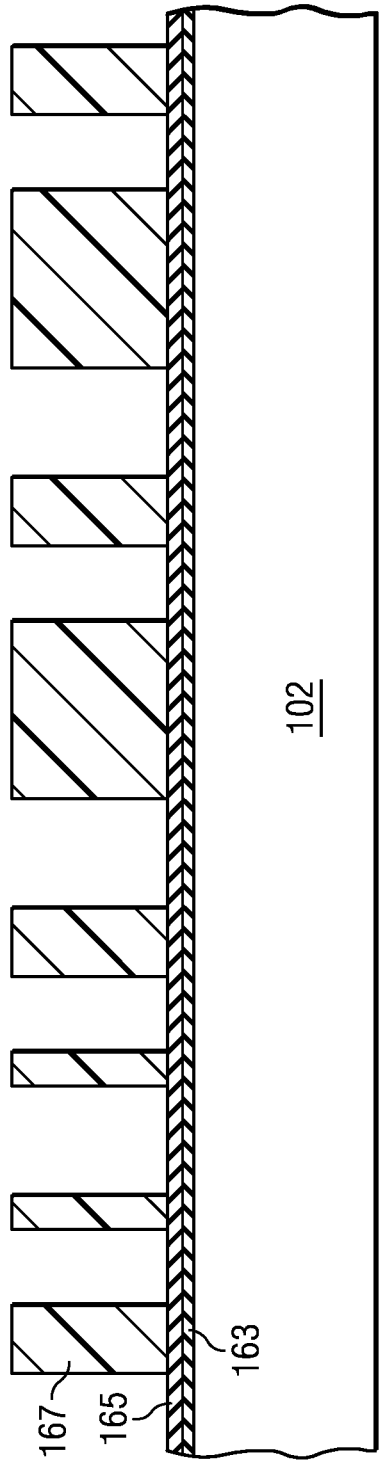
FIGS. 10A-10G illustrate various steps in the fabrication of integrated circuits containing thermoelectric generators and transistor switches formed according to principles of the invention.

FIG. 10A shows a nitride layer 165 formed on an oxide layer 163 over a substrate 102 of semiconductor (e.g., p-doped silicon) material; and a layer of masking material 167 (e.g., photoresist) has been patterned into a shallow trench isolation (STI) trench etching pattern.

Figure 10B:
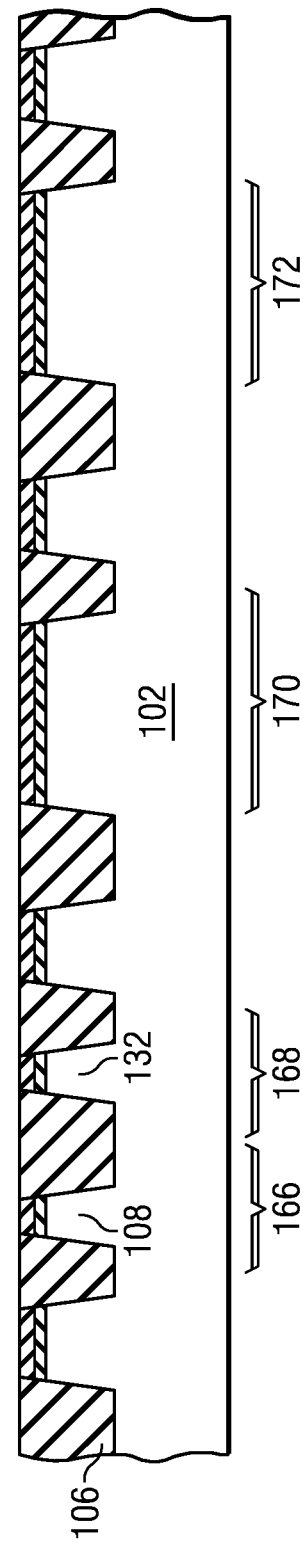

FIG. 10B shows the same structure after trenches have been formed in the top surface of substrate 102 by etching the semiconductor material through the openings in the STI pattern of masking material layer 167. The trenches have been lined with a dielectric material such as a thermally grown oxide, then filled dielectric material such as high aspect ratio plasma oxide (HARP) deposited over the whole structure, then planarized (e.g., using chemical-mechanical polishing) down to the nitride layer 165. The STI isolation regions 106 thus formed define p-type and n-type thermopile regions 166, 168 for formation of thermopiles 108, 132 and at the same time define NMOS and PMOS transistor regions 170, 172 for formation of transistor switches.

Figure 10C:
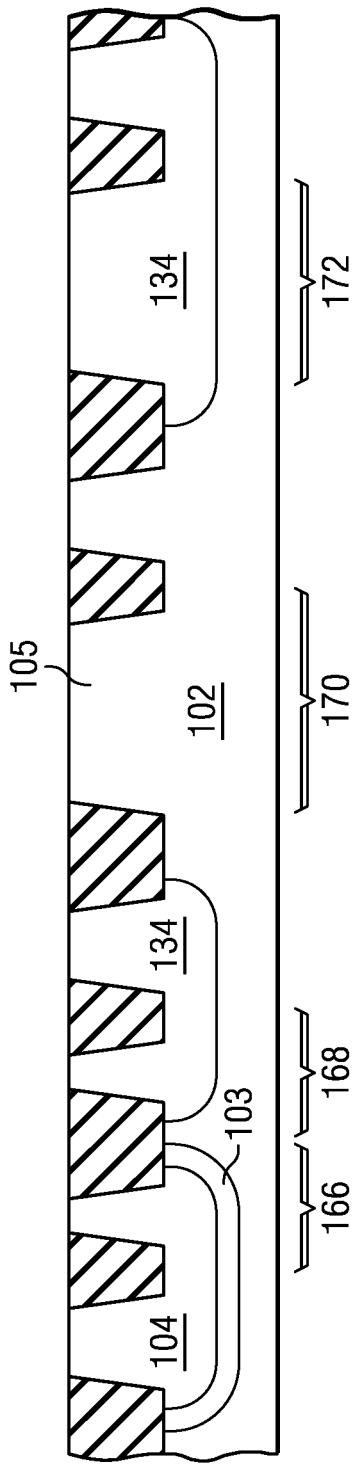

FIG. 10C shows the integrated circuit after removal of the nitride and oxide layers 165, 163 and selective n-type and p-type dopant implantations to form deep nwell 103, isolated pwell 104, pwell 105 (e.g., additional p-type doping of a lightly doped p-type substrate), and isolated nwells 134. Such implantations may, for example, be formed using mask deposition/patterning, dopant implantation, and annealing steps applied in accordance with typical (e.g., CMOS) process flows applicable to fabrication of transistors. It is contemplated, though not required, that separate mask patterning and implants will normally be used for formation of the different conductivity type wells (i.e., pwells 104, 105 and nwells 103, 134). It is also noted that the illustrated ordering contemplates well formation after formation of the STI isolation regions 106; although this is not a requirement and other ordering of steps may be possible.

Figure 10D:
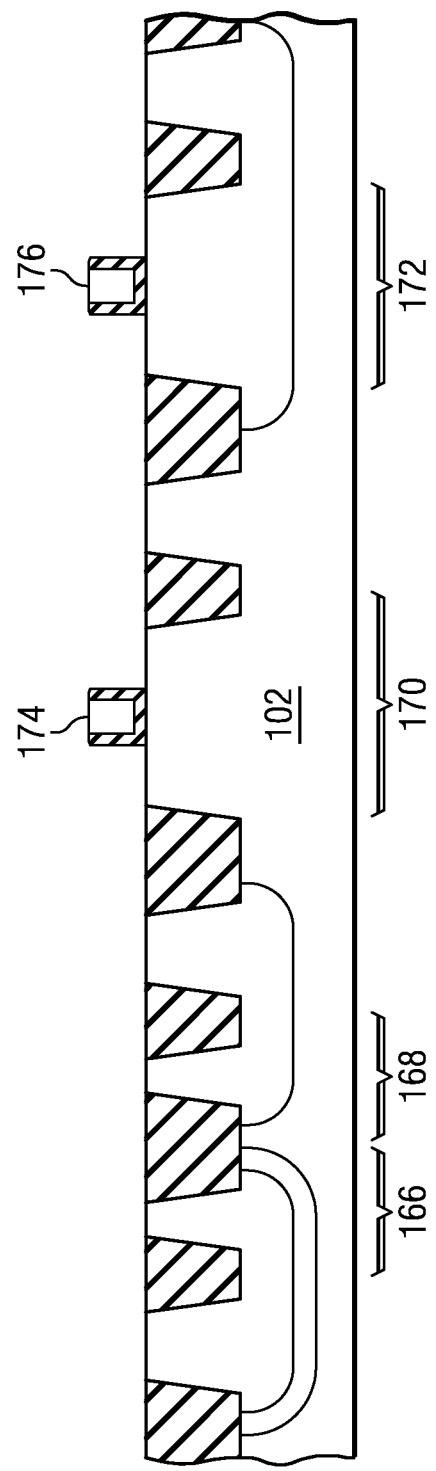

FIG. 10D shows the same structure after formation of NMOS and PMOS transistor gates 174, 176. Here, too, customary (e.g., CMOS) semiconductor processing steps can be utilized, such as growing or depositing a gate dielectric material layer (e.g., silicon oxide or high k material) over the substrate 102, depositing a gate electrode material layer (e.g., polysilicon) over the gate dielectric material layer, and patterning the same to form the illustrated gate structures.

Figure 10E:
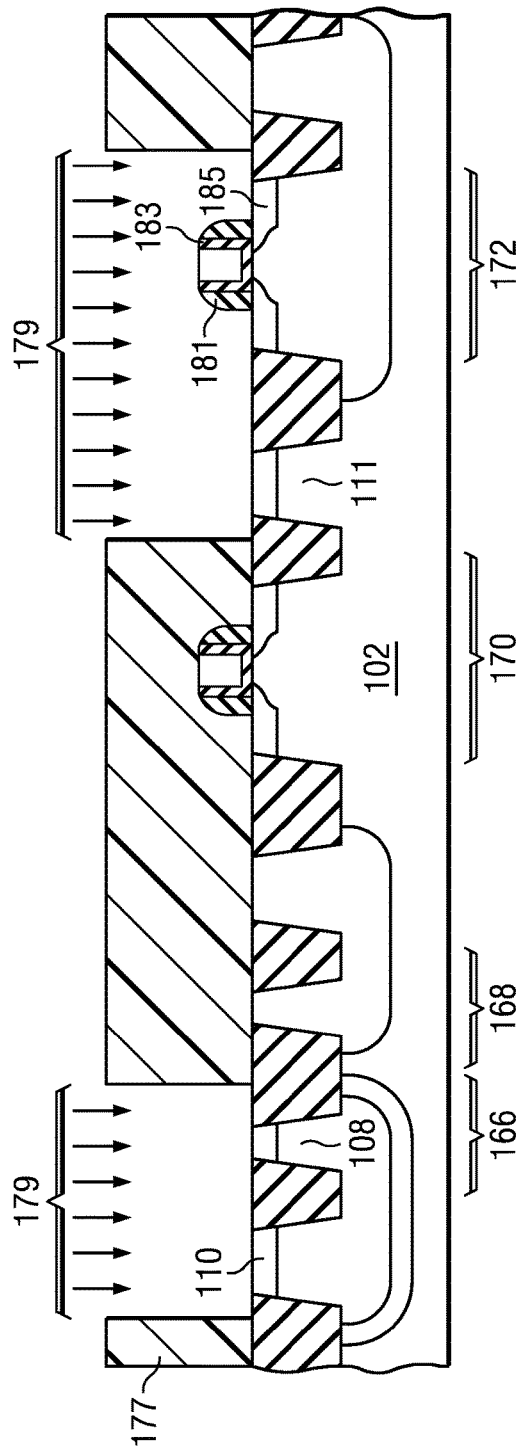

FIG. 10E shows the structure during selective implantation 179 for heavily doped PMOS transistor source/drain regions 185 and heavily doped thermogenerator pwell contact regions 110. Lightly or medium doped PMOS and NMOS transistor extension regions have already been implanted following formation of offset sidewall spacers 183 (e.g., using known processes), and source/drain sidewall spacers 181 have been subsequently formed (e.g., also using known processes) for self-alignment of the illustrated source/drain region implant. Masking for the p-type source/drain implant is provided by a layer of masking material 177 (e.g., photoresist) that is patterned with a PMOS source/drain implant pattern to open PMOS transistor region 172 and p-type thermopile region 166 to the p-type dopant implant 179. This implant forms the source/drain regions of the PMOS transistor in region 172, the pwell contact region 111, the isolated pwell contact region 110, and the p-type thermopile 108 contact region.

Figure 10F:
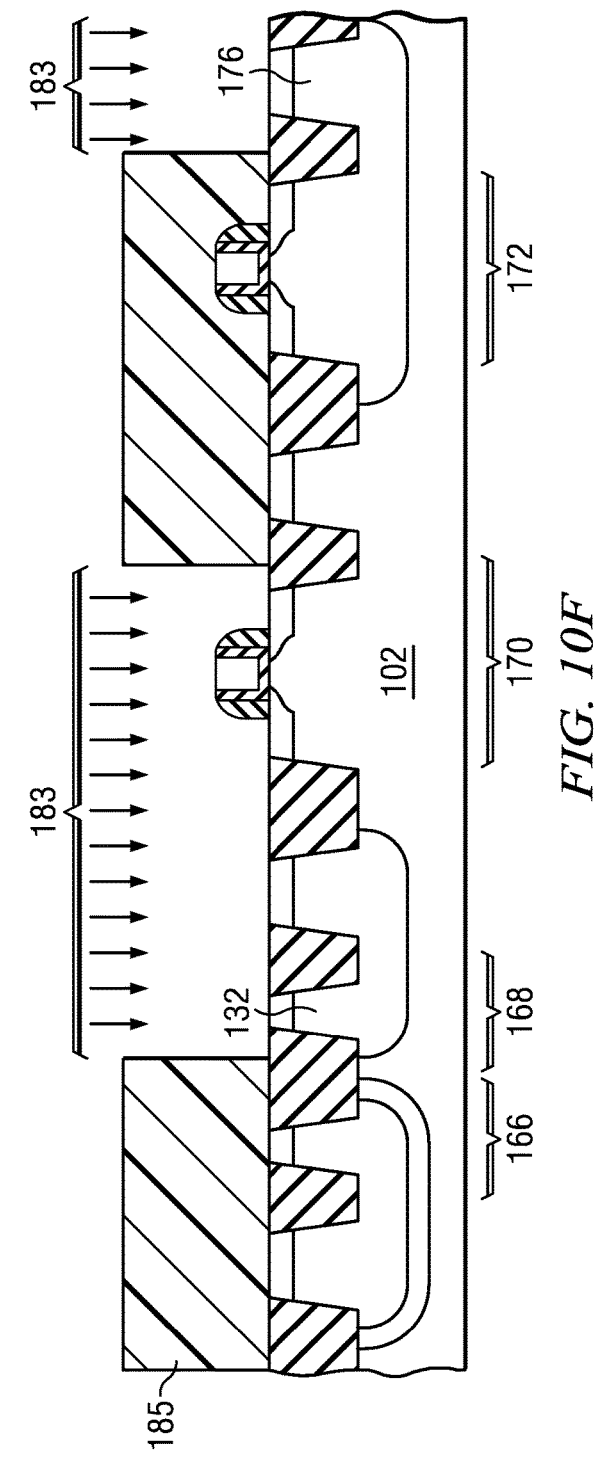

FIG. 10F shows the same structure during selective implantation 183 for the NMOS transistor source/drain regions 170 and heavily doped thermogenerator nwell contact regions. It is noted that the ordering of the implantations 179 and 183 is chosen according to the usual flow, and that the implantation 183 can be done before or after the implantation 179. Masking for the n-type source/drain implant is provided by a layer of masking material 185 (e.g., photoresist) that is patterned with an NMOS source/drain implant pattern to open NMOS transistor region 170 and n-type thermopile region 168 to the n-type dopant implant 183. This implant forms the source/drain regions of the NMOS transistor in region 170, the nwell contact region 176, and the n-type thermopile 132 contact region.

Figure 10G:
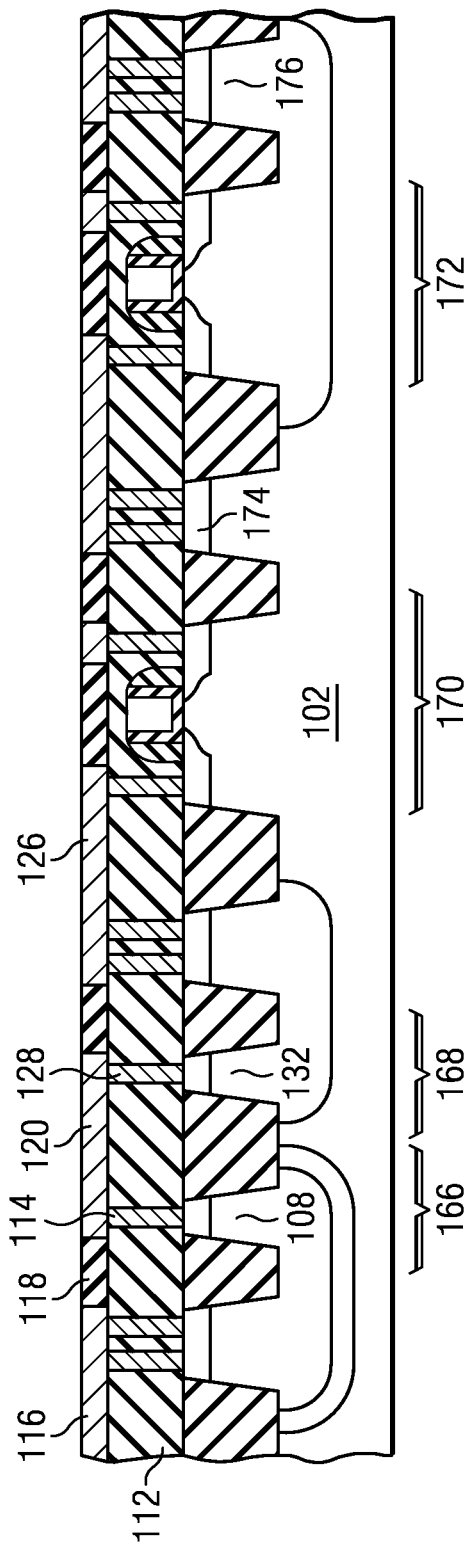

FIG. 10G shows the integrated circuit after formation of the premetal dielectric (PMD) layer 112, formation of conductive contacts 114, 128 within openings formed through the PMD layer 112, formation of the intermetal dielectric (IMD) layer 118 over the layer 112 and contacts 114, 118, and formation of metal-1 layer connecting elements 116, 120, 126 within openings formed in the IMD layer 118. Metal-1 layer connector 120 connects p-type thermopile 108 with n-type thermopile 132 to form a thermocouple. This thermocouple is formed using the same processes that form the NMOS transistor switch in region 170 and the PMOS transistor switch in region 172. The thermocouples and transistor switches may be formed simultaneously with the formation of the integrated circuit, with no additional patterning or processing steps and with no additional manufacturing cost.

Figure 11:
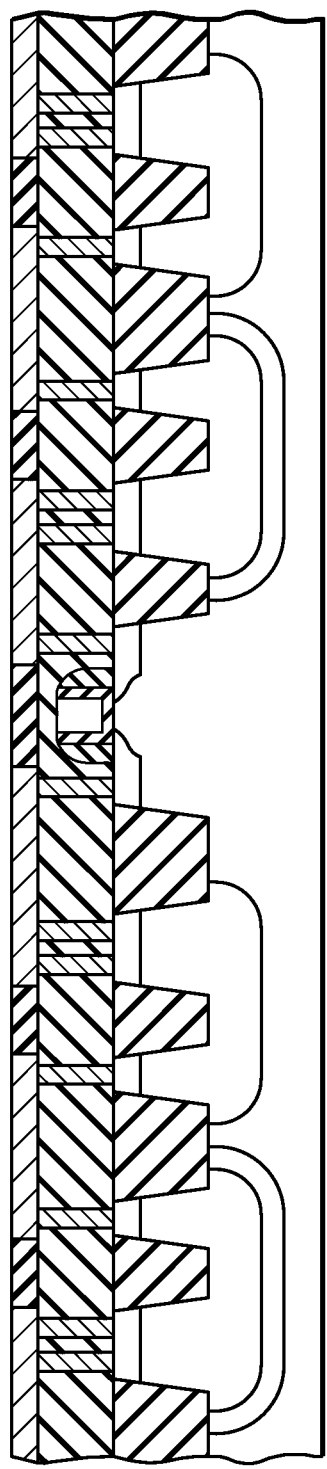
FIGS. 11-13 illustrate different arrangements of integrated circuits fabricated according to the steps shown in FIGS. 10A-10G.

FIG. 11 illustrates an NMOS transistor between two thermogenerators each comprising a structure such as shown in FIG. 1, formed together with the thermogenerators according to a simultaneous fabrication process, using steps such as those described above. The illustrated transistor may be operated under direction of circuitry on the same chip, such as power regulator 422, and row and column switch decoders 424, 426, to selectively couple the illustrated thermogenerators in series. An example state table for the NMOS transistor may be given as follows:

| NMOS | State |
| --- | --- |
| 0 | disconnected (off) |
| 1 | connected |

Figure 12:
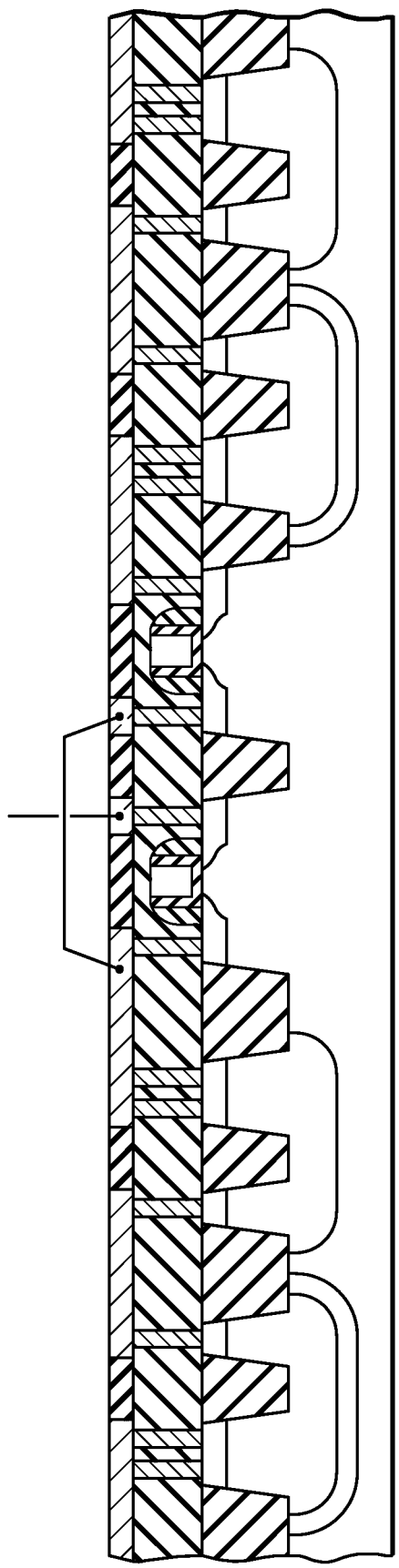

FIG. 12 illustrates two NMOS transistor switches integrally formed between two thermocouples in a simultaneous fabrication process such as described. Both NMOS transistors have their source terminals tied to the tap of a same given conductivity (e.g., n-type) thermopile of one of the thermogenerators (e.g., the left one). One of the NMOS transistors (e.g., the left one) has its drain tied to a bus (indicated schematically in FIG. 12). The other NMOS transistor (e.g., the right one) has its drain tied to the tap of the opposite conductivity (e.g., p-type) thermopile of the other of the thermogenerators (e.g., the right one). Coupling of the illustrated thermogenerators can be effected by the transistors according to the following state table:

| NMOS1 | NMOS2 | State |
| --- | --- | --- |
| 0 | 0 | disconnected (off) |
| 0 | 1 | thermocouples are connected in series. Output is at the right terminal of second (right) thermocouple. |
| 1 | 0 | first (left) thermocouple is accessed by the bus. |
| 1 | 1 | contention between the two paths |

Figure 13:
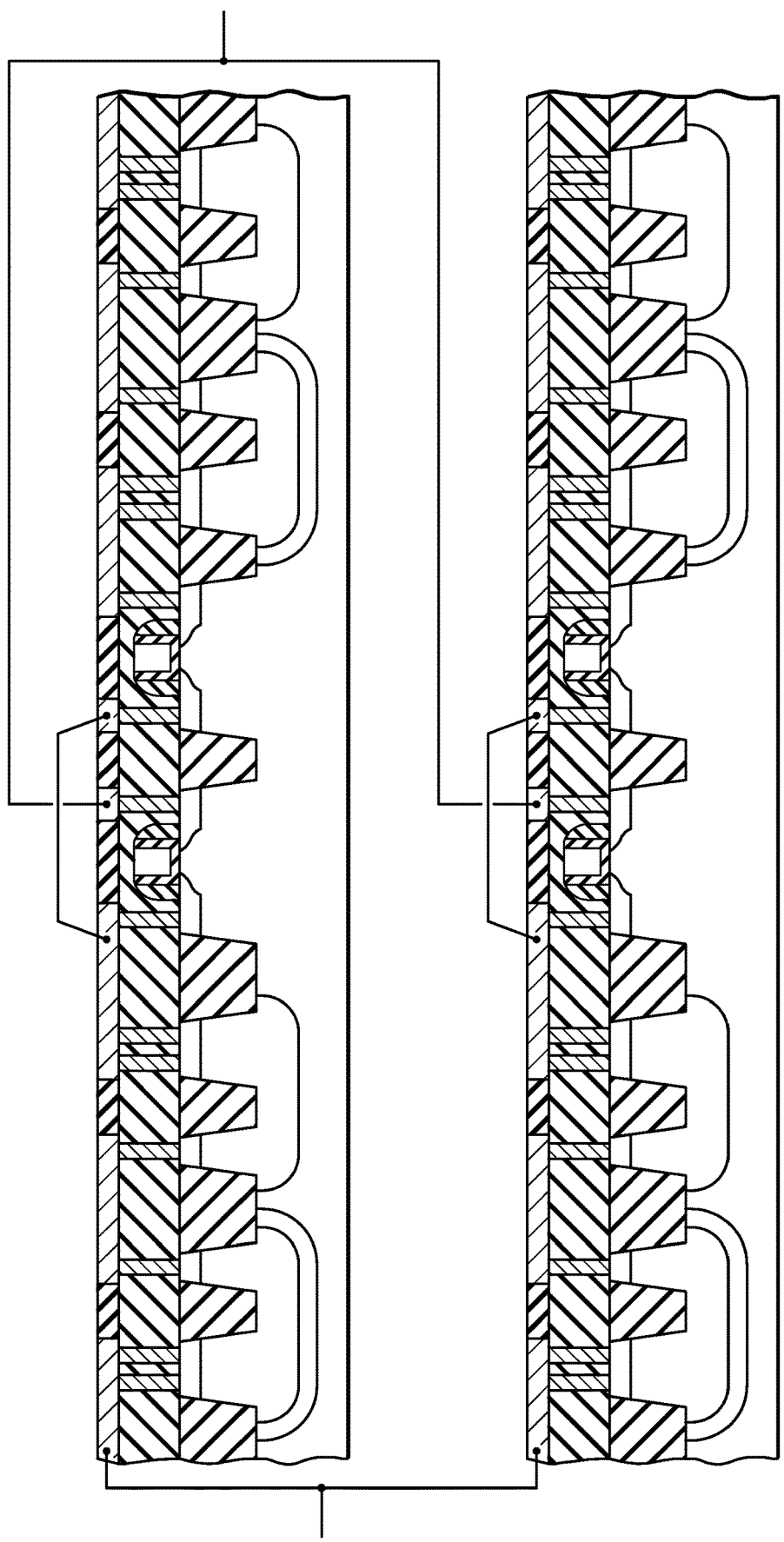

FIG. 13 illustrates two banks of two NMOS transistor switches each integrally formed between two thermocouples, all in a simultaneous fabrication process such as described. Both NMOS transistors of each bank have their source terminals tied to the tap of a same given conductivity (e.g., n-type) thermopile of one of the thermogenerators (e.g., the left one). And one of the NMOS transistors of each bank (e.g., the left one) has its drain tied to a common bus (indicated schematically in FIG. 13), illustrating an example implementation to effect the selective parallel coupling of different thermocouples using the integrated transistor switches formed in the same fabrication process.

Those skilled in the art to which this invention relates will appreciate that many other embodiments and variations are possible within the scope of the claimed invention.

What is claimed is:

1. A circuit including circuitry for a thermoelectric power supply, comprising:
 a negative terminal;
 a positive terminal;
 an array of thermogenerators monolithically formed on a semiconductor substrate, wherein each thermogenerator of the array of thermogenerators is formed from a corresponding thermopile formed at least in part within the semiconductor substrate;
 a corresponding array of transistors monolithically formed on the semiconductor substrate, the array of transistors comprising, for a given thermogenerator of the array of thermogenerators:
  a first transistor configured to selectively couple the given thermogenerator to the negative terminal;
  a second transistor configured to selectively couple the given thermogenerator to the positive terminal; and
  a third transistor configured to selectively bypass the given thermogenerator; and
 a plurality of interconnects monolithically formed on the semiconductor substrate;
 the transistors of the array of transistors interconnected through the interconnects of the plurality of interconnects to respective ones of the thermogenerators of the array of thermogenerators, the transistors of the array of transistors electrically switchable to selectively change, within the array of thermogenerators, a number N of the thermogenerators coupled in parallel and a number M of the thermogenerators coupled in series to form dynamically reconfigurable N×M arrays of the thermogenerators, to provide either
  a controlled output voltage source based on dynamically varying the number M of series connected thermogenerators, or
  a controlled output current source based on dynamically varying the number N of parallel connected thermogenerators; and
 circuitry formed on the semiconductor substrate configured for providing electrical signals to switchably control the transistors of the array of transistors to form the dynamically reconfigurable N×M arrays of thermogenerators.

2. The circuit of claim 1, wherein the thermopiles that form the thermogenerators of the array of thermogenerators are formed using a silicon etch isolation.

3. The circuit of claim 2, wherein the thermopiles are formed through employment of shallow trench isolation.

4. The circuit of claim 1, wherein the circuitry configured for providing electrical signals to switchably control the transistors of the array of transistors to form dynamically reconfigurable N×M arrays comprises row (N) and column (M) decoder circuitry.

5. The circuit of claim 1, wherein the semiconductor substrate is one of silicon and silicon germanium.

* * * * *